(12) United States Patent
Grady et al.

(10) Patent No.: US 12,405,643 B2
(45) Date of Patent: Sep. 2, 2025

(54) INTEGRATED LOCKING MECHANISM FOR DRIVE BLANKS

(71) Applicant: HEWLETT PACKARD ENTERPRISE DEVELOPMENT LP, Spring, TX (US)

(72) Inventors: John R. Grady, Cypress, TX (US); Yinggang Du, Houston, TX (US); Kevin Labbe, Tomball, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 275 days.

(21) Appl. No.: 18/163,360

(22) Filed: Feb. 2, 2023

(65) Prior Publication Data

US 2024/0264645 A1 Aug. 8, 2024

(51) Int. Cl.
*G06F 1/18* (2006.01)
*G11B 33/12* (2006.01)
*H05K 7/14* (2006.01)

(52) U.S. Cl.
CPC ............ *G06F 1/187* (2013.01); *G11B 33/123* (2013.01); *H05K 7/1409* (2013.01)

(58) Field of Classification Search
CPC ..... G06F 1/187; G11B 33/123; G11B 33/124; G11B 33/128; H05K 7/1409; H05K 7/1405

See application file for complete search history.

(56) References Cited

U.S. PATENT DOCUMENTS

| | | | |
|---|---|---|---|
| 6,819,555 B2 * | 11/2004 | Bologna | G11B 33/126 |
| 9,743,796 B2 | 8/2017 | Richardson | |
| 2009/0279249 A1 | 11/2009 | Crippen et al. | |
| 2022/0035425 A1 | 2/2022 | Chang et al. | |

OTHER PUBLICATIONS

Kim, B. et al., "Open Reference System and Tool-less Design," OCP Korea Tech Week, Samsung, Nov. 19, 2020, 23 pages.

* cited by examiner

*Primary Examiner* — James Wu
(74) *Attorney, Agent, or Firm* — Hewlett Packard Enterprise Patent Department

(57) ABSTRACT

A drive blank comprises a front member having a first end, a second end, a back face, and an aperture formed between the first end and the second end. The drive blank further has a first side member and a second side member each extending perpendicularly from the first end and the second end of the front member, respectively. The drive blank has a rear member extending parallel to the front member and between the first and second side members. A locking element is formed integral to the front member. The locking element comprises a looping portion having a first end and a second end and a push button formed at the second end of the looping portion and disposed in the aperture. The push button has a locking catch, releasably coupled to a latch element of a handle, to lock the handle in a closed position.

21 Claims, 6 Drawing Sheets

INTEGRATED LOCKING MECHANISM FOR DRIVE BLANKS

BACKGROUND

Computer systems may include one or more media drives such as, solid state drives ("SSDs"), hard disk drives ("HDDs"), CD ROM drives, or DVD drives. One or more receiving locations (e.g., drive bays) can be included in the drive cage of a computer for receiving these media drives. The media drives can either be directly mounted within those receiving locations, or may be first received in a carrier, which is itself receivable in the receiving location. A drive carrier may be used, for example, in a computing system (e.g., a server, a high-performance-compute system, a data storage appliance, a converged or hyperconverged system, or other computing systems) to facilitate installation and uninstallation (e.g., hot-swapping) of a media drive to the computing system.

A drive cage of a computing system may include multiple drive bays each of which may be filled with a drive carrier (which may be carrying a media drive) or may remain vacant (i.e., not filled with a drive carrier). Further, the vacant bays in the drive cage of a computing system may be filled with drive blanks. Drive blanks are devices that are configured to occupy a drive bay in a similar manner as a drive carrier, but which are not configured to carry a media drive. Drive blanks are generally used to fill bays that do not have drive carriers installed therein, as opposed to leaving those bays vacant. One reason to use drive blanks is to ensure proper airflow through the drive cage. Generally, air will be pulled into or exhausted from the drive cage at least in part via the drive bays, with the air flowing into or out of gaps between the devices installed in these bays. When all of the bays are occupied, the impedance to the airflow through each bay is essentially the same because the gaps in the bays are all essentially the same, and thus the air flowing through the bays will be distributed uniformly among the bays. This helps to ensure more uniform cooling of the devices in the bays, and also the other components of the computing system by directing flow of cooling air through all drive bays of the computing system. However, if one or more bays are left vacant, then the impedance through those vacant bays will be much lower than other bays, and thus more air will flow through the vacant bays, which lowers the airflow through the occupied bays, degrading the cooling of the devices in those bays, and also causes non-uniform airflow through the bays as a whole, which may degrade the cooling of the other components in the system. Blanks can be used to prevent this, as the blanks can be inserted in the vacant bays and cause those bays to have a similar impedance as the bays filled with drive carriers, thus preventing excessive flow of cooling air through the vacant drive bays. Thus, the drive blanks aid in directing the flow of cooling air through the drive cage of the computing system by allowing even distribution of cooling air between vacant bays and bays filled with a drive (or a drive carrier). Another reason to use drive blanks is to help mitigate electromagnetic interference (EMI) due to certain types of EM radiation emitted by the devices inside the drive cage. Openings in the drive cage, such as the drive bays, act like windows through which EMI causing radiation can escape, and thus the drive carriers include EMI mitigation features, such as spring fingers that electrically connect with the drive cage, to reduce the emission of EMI causing radiation through the bay. However, if a bay is left vacant, it can be a source of EMI leakage. Thus, drive blanks often include EMI mitigation features that may be similar to those of drive carriers, so that the drive blanks can be inserted into a vacant bay to reduce the EMI leakage causing radiation through that bay. Drive blanks also prevent any unintentional mishandling of the vacant drive bays. In particular, when a drive bay is vacant, a user of the computing system may unintentionally insert another electronic component, other than a drive, in the vacant drive bay. This may cause the computing system to malfunction. If a vacant drive bay is filled with a blank, chances of such unintentional mishandling may be avoided.

BRIEF DESCRIPTION OF THE DRAWINGS

The present disclosure is best understood from the following detailed description when read with the accompanying figures, wherein.

Figure 1:
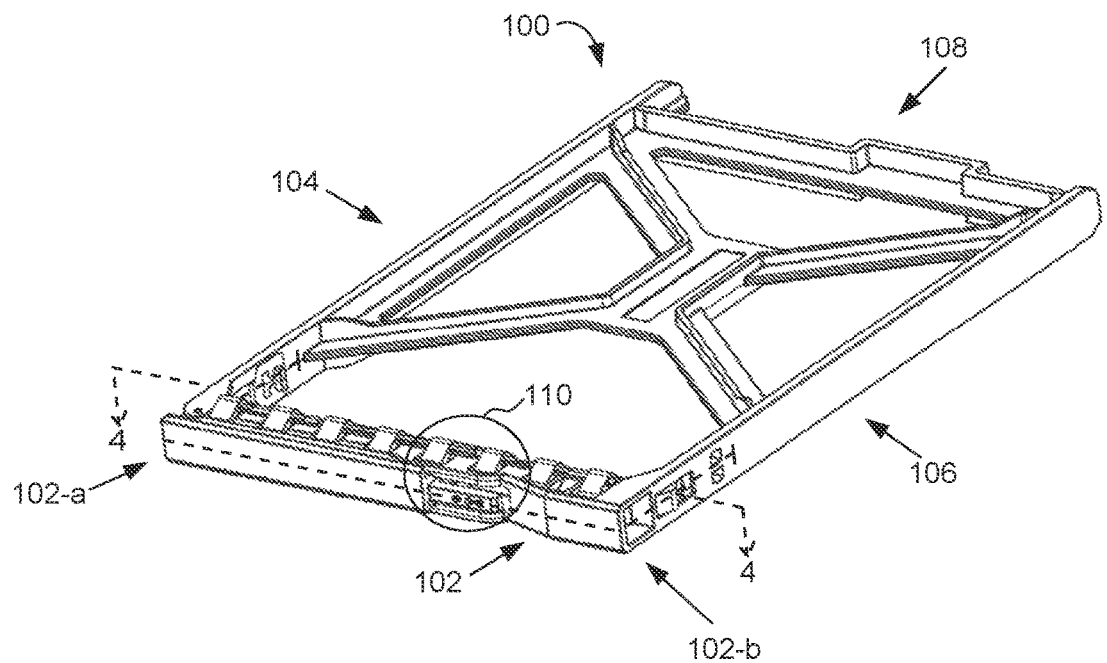
FIG. 1 is a front isometric view illustrating an drive blank, according to an example of the present subject matter.

It is emphasized that in accordance with the standard practice in the industry, various features are not drawn to scale. In fact, the dimensions of the various features may be arbitrarily increased or reduced for clarity of discussion or illustration.

DETAILED DESCRIPTION

Illustrative examples of the subject matter claimed below are disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

As used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

As used herein, to "provide" an item means to have possession of and/or control over the item. This may include, for example, forming (or assembling) some or all of the item from its constituent materials and/or, obtaining possession of and/or control over an already-formed item.

Drive carriers are used to configure media drives, such as SSDs, as FRUs, allowing the drives to be hot swapped into a computing system. Drive carriers are therefore defined by the physical form of the SDD, or drive, which they are configured to carry and are standardized by an industry form factor (e.g., an SDD form factor). An Enterprise & Data Center Standard Form Factor (EDSFF), for example, is designed for use in data centers in servers with storage devices such as SSDs. As a form factor, it defines specifications such as the dimensions and electrical interfaces storage devices should have, to ensure data center operators, server manufacturers, and SSD manufacturers, can make products that work with products from multiple manufacturers. As used herein, an EDSFF drive therefore refers to a drive that has a form factor specified in one of the standards in the EDSFF family of standards, including, but not limited to, a form factor specified in SFF-TA-1006, SFF-TA-1007, or SFF-TA-1008, and an EDSFF drive carrier is a drive carrier configured to carry and support an EDSFF drive.

Due to the small size of emerging EDSFF technologies, drive carriers designed to support EDSFF drives (EDSFF drive carriers) are significantly smaller than those designed for previous drive technologies (e.g., HDDs, SSDs conforming to M.2 or U.2 specifications, etc.) Similarly, drive blanks designed to fill vacant EDSFF drive bays (EDSFF drive blanks) are also significantly smaller than drive blanks developed for previous drive technologies. The small size of such EDSFF drive blanks raises various new issues. Given the larger size of drive blanks for previous drive technologies, in the past, it was possible to use a squeeze latch to retain and release such drive blanks. As the size of the drive carrier (and corresponding drive blank) decreases, however, it may not be feasible to use a squeeze latch to retain and release an EDSFF drive blank from the drive bay due to space constraints of installing such squeeze latch.

Moreover, in the past, it was possible to use handle based latching mechanisms to lock a drive blank in place inside a drive cage of a computing system. Such handle based locking mechanisms used in the past, generally had a handle which would be locked by a locking mechanism separately mounted on the drive blank. However, for EDSFF drive blanks, there may be insufficient space available for separately mounting the locking mechanism of the handle on the drive blank. Thus, it may not feasible to lock the EDSFF drive blank using such systems that use a locking mechanism separately mounted on the drive blank. Also, attaching and tooling such locking mechanism on the EDSFF drive blank may be complex due to space constraints of the EDSFF drive blank. Further, such handle-based locking mechanisms for previous drive technologies generally employ multiple disjoint components to be installed (e.g., mounted) on the drive blank or drive bay for securing the drive blank inside the drive bay. For EDSFF drive blanks, however, installing such multiple disjoint components may be complex and time consuming due to the compactness of the EDSFF drive blanks. Further, installing such multiple disjoint components may also involve additional tooling costs.

To address the challenges associated with drive blanks for small drives, including EDSFF drives, the present disclosure contemplates an improved drive blank and assembly that, among other things, provide a compact locking system that is integral to the drive blank, such that the locking system is formed as a single piece along with the drive blank. Also, since the locking system is not separate from the drive blank, it need not be installed or mounted on the drive blank, thereby reducing assembly and tooling costs. In some implementations, the drive blank as disclosed herein comprises a locking element that is integral to a front member of the drive blank frame. The locking element is responsible for locking a handle that, in a closed position, holds the drive blank inside a slot in a drive cage of a computing system (e.g., a rack). The compact design and placement of the locking element allows the locking element to be formed to be integral to the drive blank frame.

FIG. 1 is a front isometric view illustrating a drive blank 100 according to an example of the present subject matter. The drive blank 100 comprises a front member 102 having a first end 102-$a$ and a second end 102-$b$. The front member 102 is a frame element of the drive blank 100 that is designed to face a user of the drive blank 100 when the drive blank 100 is inserted in a bay of a drive cage of a computing system, such as a bay 707 of drive cage 700 shown in FIG. 7A. The drive blank 100 further comprises a first side member 104 and a second side member 106. The first side member 104 extends perpendicularly from the first end 102-1 of the front member 102 and the second side member 106 extends perpendicularly from the second end 102-$b$ of the front member 102.

The drive blank 100 further comprises a rear member 108 extending parallel to the front member 102 and between the first side member 104 and the second side member 106. Thus, in this example, the drive blank 100 has a substantially rectangular frame structure. The front member 102, the first side member 104, the second side member 106, and the rear member 108, are connected such that together they form a frame structure that can fill a vacant drive bay in a drive cage of a computing system. In some examples, the drive blank 100 is designed to fit in a bay of a drive cage of a computing system for housing a media drive for an electronic device (e.g., a computing device), including, but not limited to an SSD. It should be understood, however, that in other examples the drive blank may have different dimensions, shapes, and that various structural details may differ from those shown in the example of FIG. 1. Moreover, in some implementations the drive blank 100 may have different numbers and arrangements of the illustrated components and may also include other parts that are not illustrated.

In some examples, the drive blank 100 may be inserted in a bay of a drive cage of a computing system to prevent improper cooling and thermal damage. During operation, bays of the computing system are populated either with an SSD component or a drive blank, such as the drive blank 100 of FIG. 1. The drive blank 100 comprises a locking element 110 integral to the front member 102. The locking element 110 is shown in further details in FIG. 3.

In various implementations, the front member 102, the first side member 104, and the second side member 106 are formed from a plastic material. The front member 102, the first side member 104, and the second side member 106 may for example, be integrally formed together from a polycarbonate. Furthermore, in some implementations, the front member 102, the first side member 104, and the second side member 106 are formed from polycarbonate/acrylonitrile butadiene styrene (PC-ABS).

Figure 2:
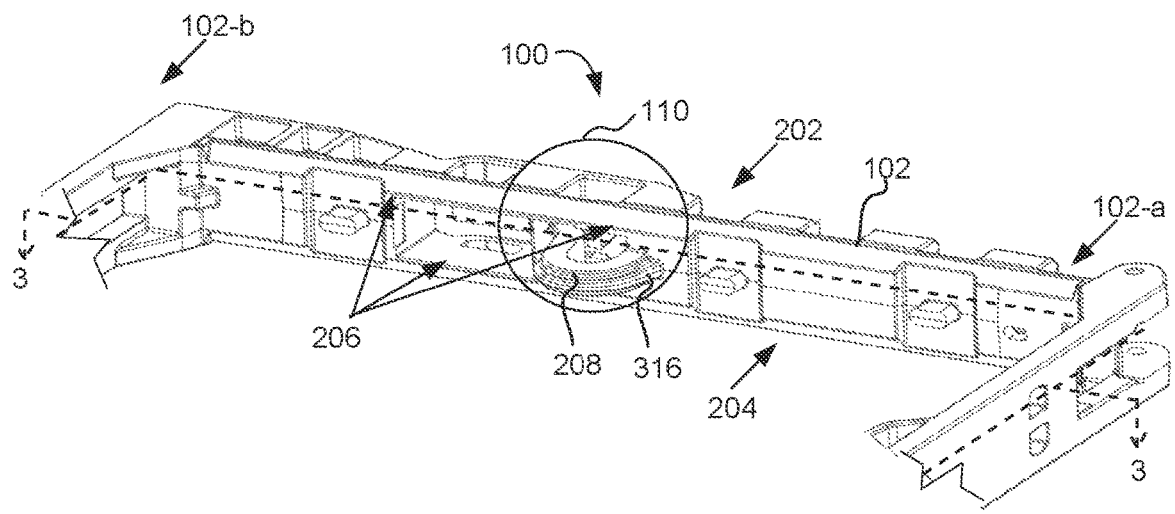
FIG. 2 is a rear isometric partial view of the drive blank of FIG. 1.

FIG. 2 is a rear isometric partial view of the drive blank 100 of FIG. 1. In the view of FIG. 2, the drive blank 100 is shown as it appears when viewed in a direction from the rear member 108 (not shown in FIG. 2) towards the front member 202. With reference to FIG. 2, the front member 102 has the first end 102-a, the second end 102-b, a front face 202, and a back face 204 opposing the front face 202. The back face 204 refers to a surface of the front member 102 that faces the rear member of the drive blank 100. Further, the front member 102 has an aperture 206 between the first end 102-a and the second end 102-b. The aperture 206 refers to a through hole formed on the front member 102. At least a portion of the locking element 110 is disposed in the aperture 206. The locking element 110 is integral to the front member 102. The locking element 110 comprises a looping portion 208 as shown in FIG. 2. The portions of the locking element 110 are shown in further details in FIG. 3.

Figure 3:
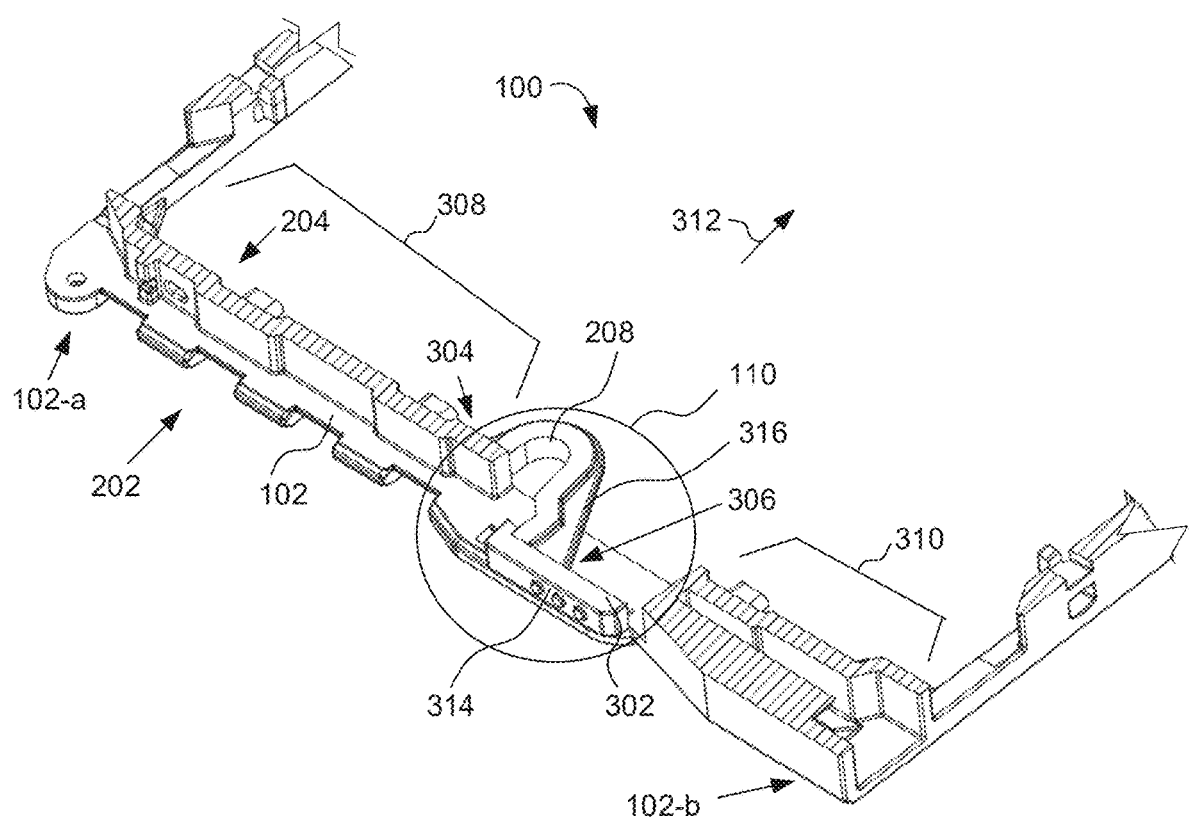
FIG. 3 is a top isometric sectional view illustrating a portion of the drive blank of FIG. 1, with section taken along 3-3 in FIG. 2.

FIG. 3 is a top perspective sectional view illustrating a portion of the drive blank 100 of FIG. 1. The drive blank 100 comprises the locking element 110 integral to the front member 102. The locking element 110 comprises the looping portion 208 and a push button 302. The looping portion 208 has a first end 304 and a second end 306 and the push button 302 is formed at the second end 306 of the looping portion 208. The front member 102 has a first wall section 308 and a second wall section 310. The first wall section 308 and the second wall section 310 are on either sides of the aperture 206 (shown in FIG. 2) and a majority of the locking element 110, including the push button 302, is located between the two wall sections, i.e., the first wall section 308 and the second wall section 310. The first end 304 of the looping portion 208 is integrally coupled to the back face 204 of the front member 102 (i.e., a back face of the first wall section 308). The looping portion 208 refers to an elastically bendable curved portion of the locking element 110 that protrudes generally in a direction that is perpendicular to the extending direction of the front member 102 and towards a direction of a rear member, illustrated by arrow 312, of the drive blank 100. In some examples described herein, the looping portion 208 is a U-shaped loop extending between the back face 204 of the front member 102 and a back surface of the push button 302. That is, the loop portion 208 may begin by extending from the first wall section 308 generally in the direction 312, then begin to change its direction of extend in curved manner (curving clockwise in the view of FIG. 3), until the loop has curved through approximately 180 degrees and is ultimately extending generally in a direction that is opposite the direction 312 when the loop portion 208 joins with the push button 302. Further, the push button 302 has a tactile surface 314 protruding from the front face 202, opposite to the back face 204, of the front member 102. The front face 202 of the front member 102 is a surface of the front member 102 facing the user when the drive blank 300 is installed in a drive cage of a computing system. Further, as shown in FIG. 3, the looping portion 208 comprises a flared ridge 316 extending along a perimeter of the looping portion 208 between the first end 304 and the second end 306 of the looping portion 208. The flared ridge 316 is an extension on the surface profile of the looping portion 208 along its perimeter that may add to the tensile strength of the looping portion 208. Note that in FIG. 3 the flared ridge 316 is mostly visible near the second end 306 of the looping portion 208, but as shown in FIG. 2 the flared ridge 316 also continues around the looping portion 208 to the first end 304 thereof. The flared ridge 316 tends to widen or flare out more near the first and second ends 304 and 306, which corresponds to relatively straight sections of the looping portion 208 where the looping portion 208 is extending generally along the direction 312 or opposite to the direction 312, and tends to be much narrower along the curved sections of the looping portion 208, conforming to the curved shape of the looping portion 208 in these regions. The wider portions of the flared ridge 316 along the straighter sections lends these sections increased rigidity and strength. At the first end 304, this increased rigidity and strength can help to reduce bending near the first end 304, which can help to reduce stress on the junction between the looping portion 208 and the wall section 308. At the second end 306, the increased rigidty and strength can help prevent bending of the push button 302 relative to the looping portion 208. In other words, in addition to strengthening the looping portion 208, the flared ridge 316 may help to confine the bending to predominantly portions that are intended to bend (e.g., the curved section) while reducing bending in portions that is desired to not bend.

Figure 4A:
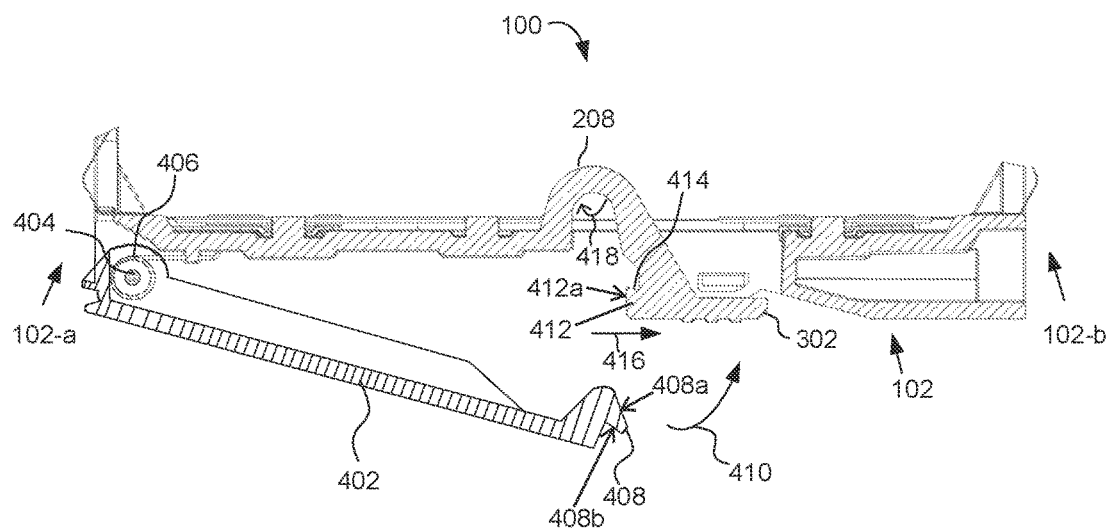
FIG. 4A is a cross section view illustrating a portion of the drive blank of FIG. 1, with the section taken along 4-4 in FIG. 1.
Figure 4B:
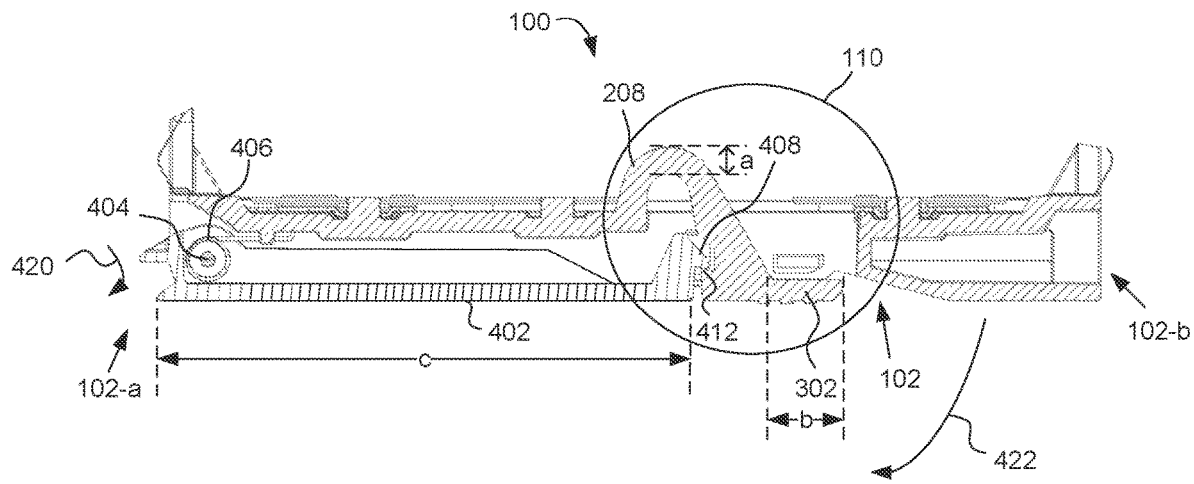
FIG. 4B is a cross section view illustrating a portion of the drive blank of FIG. 1, with the section taken along 4-4 in FIG. 1.

FIGS. 4A and 4B are cross section views illustrating a portion of the drive blank 100 of FIG. 1 in two different positions of a handle 402. In FIG. 4A, the handle 402 is in an open position and in FIG. 4B the handle is in a closed position. The handle 402 is pivotably coupled to the first end 102a of the front member 102 (and/or to the side member 104) by a pivot pin 404, which allows the handle 402 to move between the open and closed positions. The handle 402 is used to lock the drive blank 100 into the drive cage of a computing device (in the closed position of the handle) or to release the drive plank 100 therefrom (in the open position of the handle). This is accomplished via interaction between a locking pawl 508 and the drive cage, which will be described in greater detail below with respect to FIG. 5. The pin 404 may have a spring 406 attached thereto. The structure and arrangement of the pin 404 and the spring 406 are elaborated further in conjunction with the description of FIG. 6. The handle 402 so fastened to the drive blank 100 may be rotatable pivotally around the pin 404. The spring 406 may engage with the front member 102 and the handle 402 so as to exert a spring force thereon that biases the handle 402 toward the open position. That is, when the handle 402 is moved from the open position of FIG. 4A to the closed position as shown in FIG. 4B, the spring 406 gets compressed, generating a restorative spring force urging the handle 402 towards the open position.

As shown in FIGS. 4A and 4B, the handle 402 has a latch element 408 at an end opposite to the end of the handle 402 that is pivotally secured to the drive blank 100 via the pin 404. The latch element 408 is a chamfered extension from an edge of the handle 402, and comprises an angled (sloped) lead-in surface 408a on a rearward side thereof and an interlocking surface 408b on a frontward side thereof. In the open position of the handle 402, as shown in FIG. 4A, the latch element 408 of the handle 402 does not interact with any other elements of the drive blank 100. Once the drive blank 100 is inserted in a drive cage of a computing system, the handle 402 may be rotated, from the open position (as shown in FIG. 4A), in a direction of the arrow 410, towards the front member 102 of the drive blank 100. Movement of the handle 402 from the open position towards the front member 102 may result in the spring 406 getting compressed. When the handle 402 is sufficiently close to the front member 102, the angled lead-in surface 408a of the latch element 408 on the handle 402 may engage with a lead-in surface 412a of a locking catch 412 formed on an end of the push button 302, as shown in FIG. 4A. The locking catch 412 is formed at the end of the push button 302 that is away from the second end 102-b of the front member 102. As the handle 402 is further rotated closer to the front member 102 in the direction of the arrow 410, the angled lead-in surface 408a of the latch element 408 may slide against the lead-in surface 412a of the locking catch 412, imparting a force urging the locking catch 412 in the direction 416 (towards second end 102-b) which causes the looping portion 208 of the locking element 110 to bend to accommodate the motion of the locking catch 412. Once the angled lead-in surface 408a of the latch element 408 has slid past the lead-in surface 412a of the locking catch 412, the force exerted by the latch element 408 on the locking catch 412 ceases and thus there is no longer any force holding the looping portion 415 in the bent state. Accordingly, the elastic restoring force generated by the bending of the looping portion 415 now causes the looping portion 415 to elastically rebound to its original position, along a direction of the arrow 418, which causes the latch element 408 to move back towards its original position. The latch element 408 moving back to its original position allows the interlocking surface 408b of the latch element 408 to interlock against the interlocking surface 414 of the locking catch 412. That is, the locking catch 412 moves back to its original position thereby locking the latch element 408 behind it and consequently retaining the handle 402 in the closed position, as shown in FIG. 4B. The closed position refers to a position of the handle 402 (as shown in FIG. 4B) in which the latch element 408 of the handle 402 interlocks with the locking catch 412, such that the handle 402 retains the drive blank 100 inside a drive cage of a compute system. In the closed position of the handle 402, the spring 406 may be in a fully compressed state and may exert a force on the handle 402 in a direction of the arrow 420. Since, the locking catch 412 interlocks with the latch element 408 in the closed position, the handle 402 is prevented from moving away towards the open position due to the force exerted by the spring 406. As a result, the drive blank 100 is also held inside the drive cage by the handle 402 in the closed position.

To release the handle 402 from the closed position to the open position, a force may be applied to the push button 302 which causes the looping portion 208 to elastically bend, moving the push button 302 in a direction towards the second end 102-b of the front member 102 away from the latch element 408. As the push button 302 moves away from the latch element 408, the interlocking between the latch element 408 and the locking catch 412 may no longer be there. Thus, the force exerted by the compressed spring 406 in the closed position of the handle 402 may rotate the handle 402 in the direction of arrow 422 as shown in FIG. 4B, away from the front member 102 of the drive blank 100 thereby moving the handle 402 back to the open position. In some examples, the push button 302 may be subjected to an amount of force ranging from about 0.5 pounds to about 0.6 pounds to deflect the push button for about 0.65 millimeter to about 0.70 millimeter such that the handle 402 is moved from the closed position to the open position along the direction of the arrow 422. Since, the locking element 110 does not employ a separate button and button spring, additional parts, labor to assemble such additional parts, and a higher development cost arising from tooling of the additional parts may be avoided. This may provide a locking mechanism for the drive blank that is cost effective in addition to being compact as per the EDSFF form factor requirements.

Further, as shown in FIG. 4B, the looping portion 208 may have a thickness "a" at a portion where the curvature/bend of the looping portion 208 is the greatest. In some examples, the thickness "a" may be in a range between about 2 millimeters (mm) to about 3 mm. The push button 302 may have a length "b". In some examples, the length "b" may be in a range between about 4 mm to about 6 mm. The handle may have a length "c". In some examples, the length "c" may be in a range between about 40 mm to about 50 mm.

Figure 5:
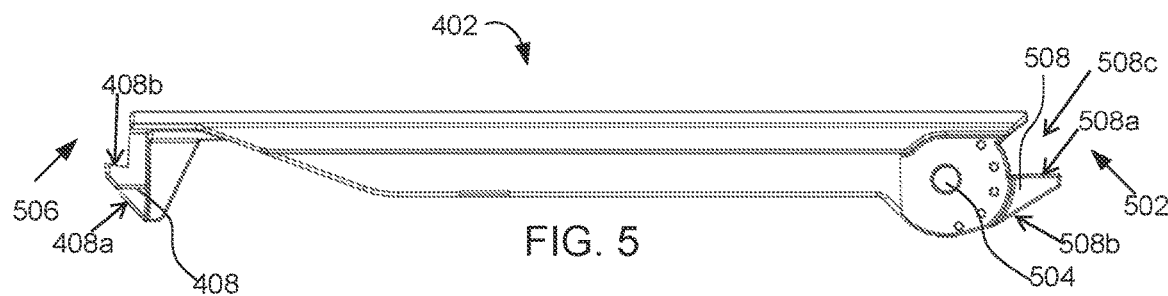
FIG. 5 is a top isometric view of a handle according to an example of the present subject matter.

FIG. 5 is an example top isometric view of the handle 402 of FIG. 4. The handle 402 comprises a first end 502 to be pivotally secured to an end of a first side member of a drive blank, such as the first side member 104 of the drive blank 100. The first end 502 has a through hole 504 through which a pin may pass and act as a pivot. The handle 402 when assembled with the drive blank may rotate about the first end 502. The handle 402 has a second end 506, opposite to the first end 502, bearing the latch element 408. The latch element 408 is a component in the handle 402 that engages with a locking catch, such as a locking catch 412 of FIG. 4, in the locking element 110 to lock the handle 402 in the closed position. The handle 402 comprises a locking pawl 508 at the first end 502. The locking pawl 508 is a protrusion to movably engage with a side rail of a drive cage of a computing system in which the drive blank is to be inserted. A locking pawl engages with a fixed component to prevent movement of another component in one or more directions. In some examples described herein, the locking pawl 508 formed on the first end 502 of the handle 402 may engage with a siderail of a drive cage, when the handle 402 is in the closed position, to prevent removal of the blank 100 form the drive cage. Specifically, the pawl 508 and a front portion of the handle 402 may define a slot 508c therebetween and the side rail of the drive cage may be received within this slot 508c when the blank 100 is installed in the drive cage and the handle 402 is in the closed position; furthermore, in this state a forward facing surface 508a of the pawl 508 blocks the side rail to prevent translational motion of the drive blank 100 out of the drive cage. In other words, when the handle 402 is in the closed position the locking pawl 508 prevents removal of the drive blank 100 from the drive cage. In some examples, the pawl 508 may also assist in fully installing the drive blank 100 in the drive cage; for example, the drive blank 100 may be inserted part way into the bay and then the handle is rotated from open position to closed position causing the pawl 508 to engage the drive cage, and as the pawl 508 is rotated it acts as a cam to force the drive blank 100 to move the rest of the way into the fully installed position. In addition, a rearward surface 508b of the pawl 508 may engage the front member 102 as the handle 402 is rotated toward the open position to limit rotational movement of the handle 500 402 beyond an the open position.

Figure 6:
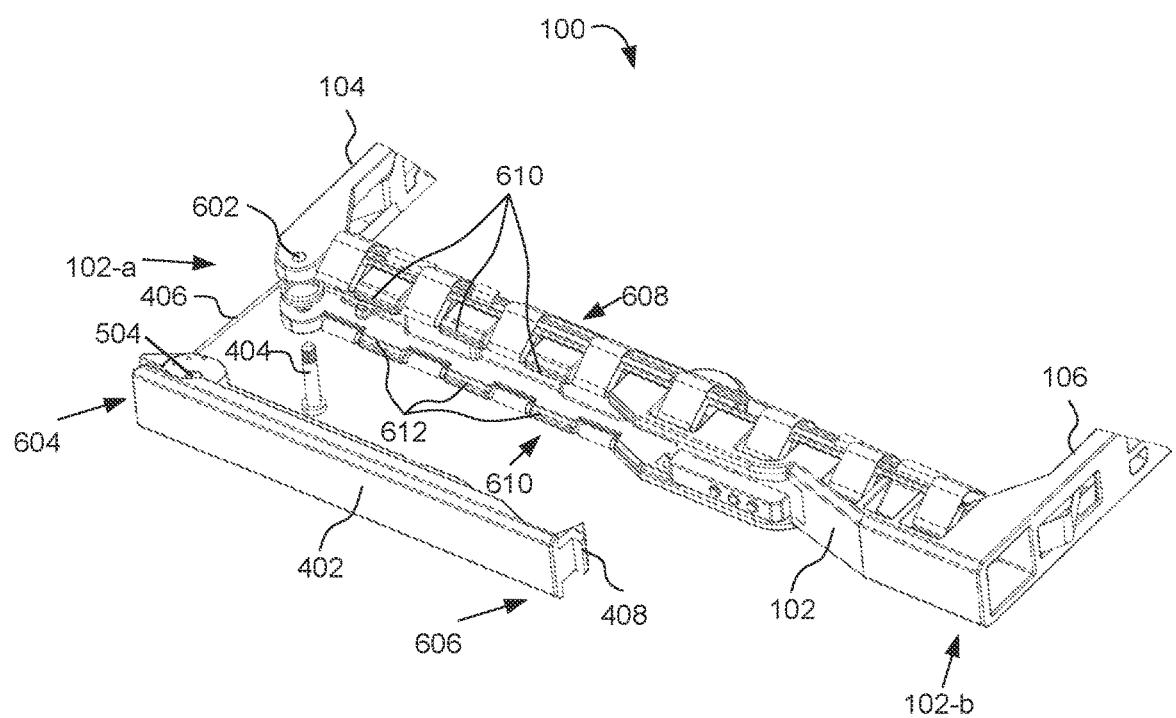
FIG. 6 is a front isometric view of the drive blank of FIG. 1.

FIG. 6 shows an isometric view of a drive blank 100 according to an example of the present subject matter. In FIG. 6, a partial view of the first side member 104 and a partial view of the second side member 106 is shown.

The first side member 104 comprises a pair of retention holes 602 for the handle 402, one disposed on a top side of the handle 402 and another disposed on a bottom side of the handle 402. The handle 402 has a first end 604 and a second end 606. The first end 604 of the handle 402 is pivotally secured to an end of the first side member 104 via the retention holes 602. The handle 402 has a bore 504 that is aligned with the retention holes 602, and the pin 404 passes through the bore 504 and the retention holes 602 and thereby fastens the handle 402 to the first side member of the drive blank 100 in a manner that allows pivoting of the handle 402. The handle 402 has the second end 606, opposite to the first end 604, bearing the latch element 408.

Further, the retention holes are 602 positioned at the end of the first side member 104 that is adjacent to the first end 102-a of the front member 102. The drive blank 100 further comprises the pin 404 to pivotally secure the handle 402 in the retention holes 602. The spring 406 is configured to bias the handle 402 in an open position.

Further, as shown in FIG. 6, the front member 102 comprises a first edge 608 between the first end 102-a and the second end 102-b of the front member 102. The front member 102 also has a second edge 610, opposite to the first edge 608. The first edge 608 has a first set of outward extensions 610 and the second edge 610 has a second set of outward extensions 612. The first and second set of outward extension 620 and 622 together form a channel therebetween to hold the handle 402 in the closed position. That is in the closed position of the handle 402, the handle 402 may be fitted between the first and second set of outward extension 610 and 612.

Figure 7A:
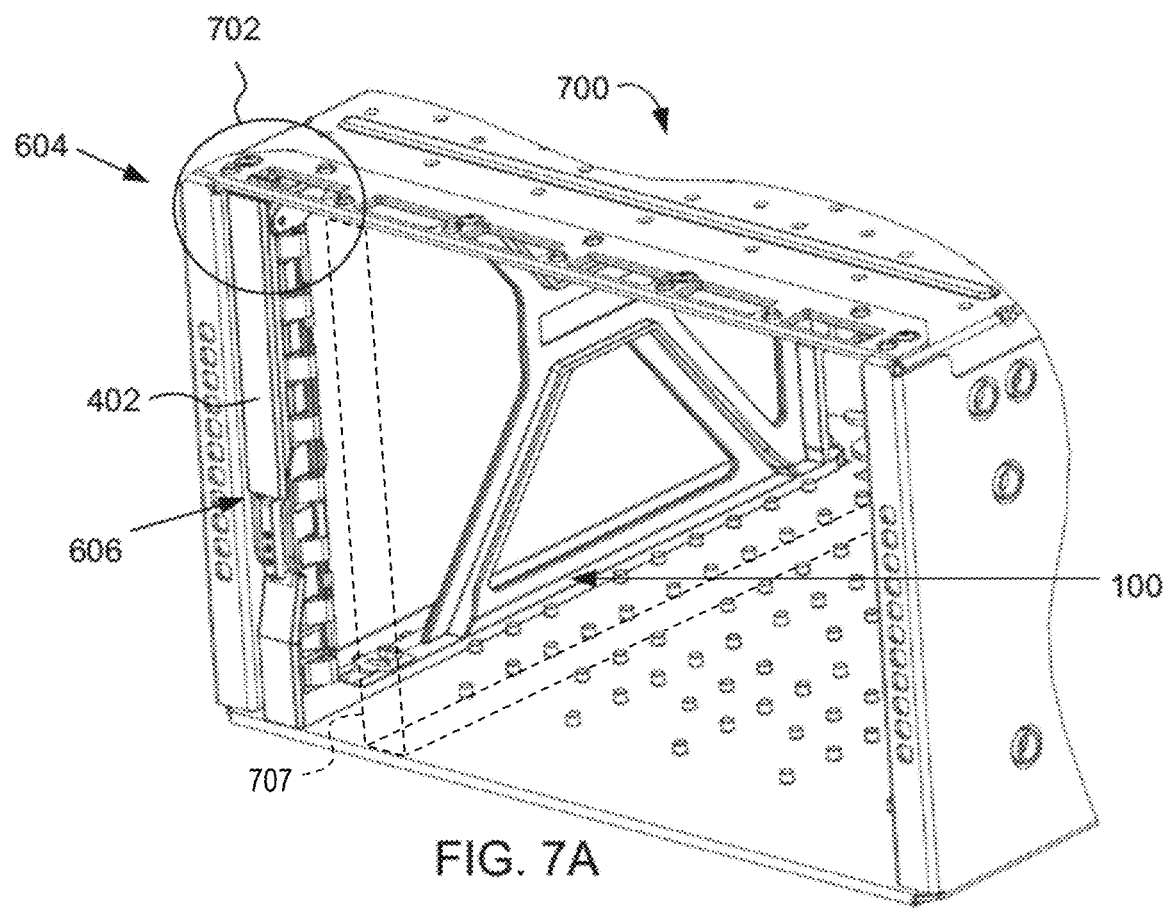
FIG. 7A is an isometric view of a drive cage of a computing system fitted with the drive blank of FIG. 1.
Figure 7B:
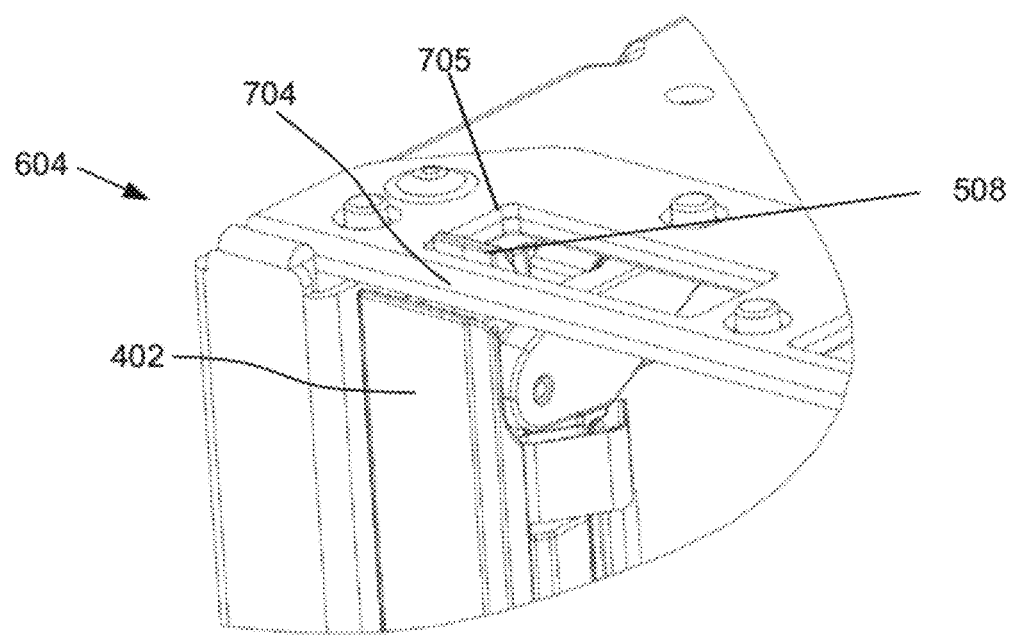
FIG. 7B is a partial isometric view of a portion of the drive cage of the computing system of FIG. 7A.

FIG. 7A shows a drive cage 700 of a compute system fitted with the drive blank 100 of FIG. 1. The drive cage 700 comprises bays 707, as described above (only one is labeled in FIG. 7A, but multiple are shown). The drive blank 100 is fitted with the handle 402 with the first end 604 and the second end 606. The handle 402 may movably engage with a siderail 704 of the drive cage 700. The connection between the handle 402 and the drive cage 700 is shown in greater detail in FIG. 7B. FIG. 7B shows a magnified view of the circular portion 702 identified in FIG. 7A. As shown in FIG. 7B, the handle 402 comprises the locking pawl 508 at the first end 604. The locking pawl 508 extends into a cut-out 705 or recess in the drive cage 700 to movably engage with a side rail 704 of the drive cage 700 in which the drive blank 100 is inserted. When the drive blank 100 is installed in the drive cage 700 and the handle 402 is closed, the side rail 704 is received in the slot 508c defined between a front of the handle 402 and the pawl 508, with the side rail 704 contacting or blocking the forward facing surface 508a of the pawl 508 to lock the drive blank 100 in the drive cage 700.

Figure 8:
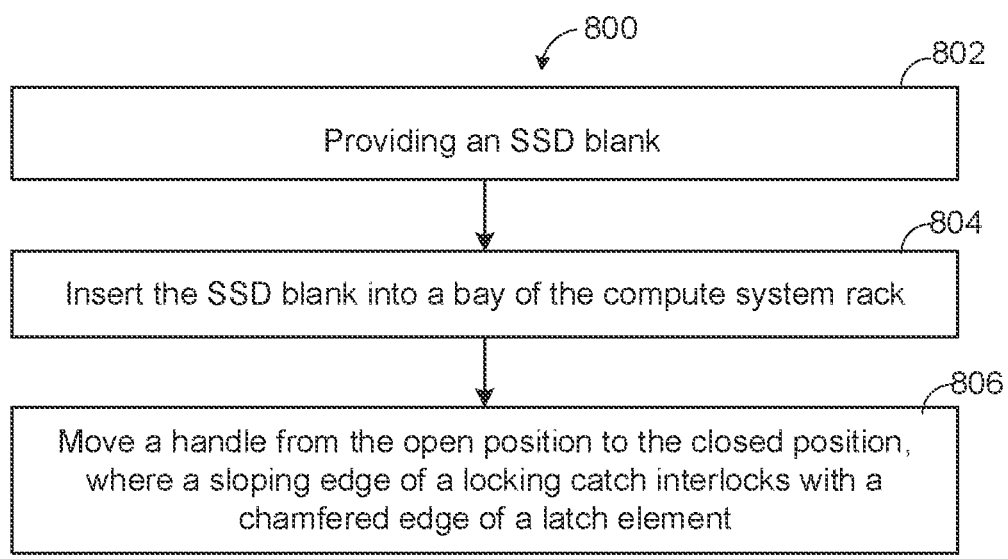
FIG. 8 is a method of installing a drive blank in a drive cage of a computing system, according to an example of the present subject matter.

FIG. 8 shows a method 800 of installing a drive blank in a computing system, according to an example of the present subject matter. The drive blank may be similar to the drive blank 100 as illustrated in any of the FIGS. 1-6 above. The method 800 comprises at block 802, providing the drive blank. The drive blank comprises a front member having a first end, a second end, a back face, and an aperture formed between the first end and the second end. The drive blank further comprises a first side member extending perpendicularly from the first end of the front member, a second side member extending perpendicularly from the second end of the front member, and a rear member extending parallel to the front member and between the first side member and the second side member. The drive blank comprises a locking element integral to the front member, where the locking element comprises a looping portion having a first end and a second end, the first end of the looping portion abutting the back face of the front member. In some examples, the looping portion comprises a first end abutting a back face of the front member, a second end, opposite to the first end, and a flared ridge extending, between the first end and the second end, along a perimeter of the looping portion. Further, the drive blank has a push button formed at the second end of the looping portion and disposed in the aperture, the push button having a locking catch, releasably coupled to a latch element of a handle, to lock the handle in a closed position, where the push button is movable towards the rear member to elastically bend the looping portion to release the latch element from the locking catch, such that the handle moves from the closed position to an open position.

The method 800 comprises, at block 804, inserting the drive blank into a bay of the computing system, such as a bay 707 of the drive cage 700 of a computing system of FIG. 7A, in a manner that the push button is exposed at a front side of the compute system. The push button is exposed at the front side, such that the push button may be accessed/pushed by a user/operator to release the handle from the closed position to the open position and pull out the drive blank from the drive cage. Once the drive blank is inserted in the drive cage, the method 800 comprises, at block 806, moving the handle from the open position to the closed position, where the locking catch interlocks with the latch element in the closed position of the handle.

In some examples, the method 800 comprises providing a retention slot for the handle at an end of the front member. Providing the retention slot may refer to forming a slot at an end of the front member. Further, a pin may be inserted in the retention slot to pivotally secure the handle in the retention slot.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

We claim:

1. A drive blank, comprising:
    a front member having a first end, a second end, a back face, and an aperture formed between the first end and the second end;
    a first side member extending perpendicularly from the first end of the front member;
    a second side member extending perpendicularly from the second end of the front member;
    a rear member extending parallel to the front member and between the first side member and the second side member;
    a handle pivotably coupled to the front member or first side member and comprising a latch element; and
    a locking element integral to the front member, wherein the locking element comprises:
        a looping portion having a first end and a second end, the first end of the looping portion integrally connected to the back face of the front member; and
        a push button formed at the second end of the looping portion and disposed in the aperture, the push button having a locking catch, releasably coupled to the latch element of the handle, to lock the handle in a closed position, wherein the push button is movable towards the rear member to elastically bend the looping portion to release the latch element from the locking catch, such that the handle is allowed to move from the closed position to an open position.

2. The drive blank of claim 1, wherein the looping portion comprises a flared ridge extending along a perimeter of the looping portion between the first end and the second end of the looping portion.

3. The drive blank of claim 1, wherein the locking catch interlocks with the latch element in the closed position of the handle.

4. The drive blank of claim 1, wherein the first side member comprises:
   a pair of retention holes for the handle at an end of the first side member that is adjacent to the first end of the front member; and
   a spring-loaded pin to pivotally secure the handle in the retention holes.

5. The drive blank of claim 4, wherein the handle comprises:
   a first end pivotally secured to the end of the first side member; and
   a second end, opposite to the first end, bearing the latch element.

6. The drive blank of claim 5, wherein the handle comprises a locking pawl at the first end, the locking pawl having a protrusion to movably engage with a side rail of a computing system in which the drive blank is to be inserted.

7. The drive blank of claim 1, wherein the latch element comprise an angled lead-in surface configured to slide against a lead-in surface of the locking catch and to force the locking catch to move aside when the handle is rotated from the open position towards the closed position.

8. The drive blank of claim 1, wherein the front member comprises:
   a first edge between the first end and the second end of the front member, the first edge having a first set of outward extensions;
   a second edge, opposite to the first edge, having a second set of outward extensions; and
   a channel formed between the first set of outward extensions and the second set of outward extensions to receive at least part of the handle in the closed position.

9. The drive blank of claim 1, wherein the push button has a tactile surface protruding from a front face, opposite to the back face, of the front member.

10. The drive blank of claim 1, wherein the drive blank is configured for insertion in a bay of a computing system.

11. The drive blank of claim 10, wherein the push button is accessible from a front side of the computing system with the drive blank being inserted in the computing system.

12. The drive blank of claim 1, wherein the handle has a length of about 40 millimeters (mm) to 50 mm.

13. The drive blank of claim 1, wherein the push button has a length of about 4 mm to 6 mm.

14. The drive blank of claim 1, wherein the push button is configured to deflect about 0.65 mm to about 0.70 mm and release the handle in response to being subjected to a force having a magnitude of about 0.5 pounds to about 0.6 pounds.

15. The drive blank of claim 1, wherein a central axis of the looping portion follows a looping path from the first end of the looping portion to the second end of the looping portion, starting at the back face of the front member and extending from the back face in a first direction towards the rear member and then looping around to extend in a second direction opposite the first direction.

16. An electronic device comprising:
   a drive cage comprising a plurality of bays each configured to receive a drive carrier;
   a drive blank configured to be installed in one of the bays in lieu of the drive carrier, the drive blank comprising:
      a front member having a first end, a second end, a back face, and an aperture formed between the first end and the second end;
      a first side member extending perpendicularly from the first end of the front member;
      a second side member extending perpendicularly from the second end of the front member;
      a rear member extending parallel to the front member and between the first side member and the second side member;
      a handle to retain the drive blank in the bay, the handle pivotably coupled to the front member or first side member and comprising a latch element; and
      a locking element integral to the front member, wherein the locking element comprises:
         a looping portion having a first end and a second end, the first end of the looping portion abutting the back face of the front member; and
         a push button formed at the second end of the looping portion and disposed in the aperture, the push button having a locking catch, releasably coupled to the latch element of the handle, to lock the handle in a closed position,
      wherein in the closed position the handle engages the drive cage to lock the drive blank in the drive cage,
      wherein the push button is movable towards the rear member to elastically bend the looping portion to release the latch element from the locking catch, such that the handle is allowed to move from the closed position to an open position, and
      wherein in the open position the handle allows the drive blank to be removed from the drive cage.

17. The electronic device of claim 16, wherein the looping portion comprises a flared ridge extending, between the first end and the second end, along a perimeter of the looping portion.

18. The electronic device of claim 16, wherein the locking catch interlocks with the latch element in the closed position of the handle.

19. The electronic device of claim 16, wherein the push button is accessible from a front side of the electronic device with the drive blank being inserted in one of the bays.

20. A method of installing a drive (SSD) blank in a computing system, comprising:
   providing the drive blank, the drive blank comprising:
      a front member having a first end, a second end, a back face, and an aperture formed between the first end and the second end;
      a first side member extending perpendicularly from the first end of the front member;
      a second side member extending perpendicularly from the second end of the front member;
      a rear member extending parallel to the front member and between the first side member and the second side member; and
      a locking element integral to the front member, wherein the locking element comprises:
         a looping portion having a first end and a second end, the first end of the looping portion abutting the back face of the front member; and a push button formed at the second end of the looping portion and disposed in the aperture, the push button having a locking catch, releasably coupled to a latch element of a handle, to lock the handle in a closed position, wherein the push button is movable towards the rear member to elastically bend the looping portion to release the latch element from the locking catch, such that the handle is allowed to move from the closed position to an open position;

inserting the drive blank into a bay of the computing system such that the push button is exposed at a front side of the computing system; and moving the handle from the open position to the closed position, wherein the locking catch interlocks with the latch element in the closed position of the handle.

21. The method of claim 20, further comprising:

providing a retention slot for the handle at an end of the front member; and inserting a spring-loaded pin in the retention slot to pivotally secure the handle in the retention slot, wherein the spring-loaded pin is to bias the handle in the open position.

\* \* \* \* \*